United States Patent [19]
Eglash et al.

[11] Patent Number: 5,251,225
[45] Date of Patent: Oct. 5, 1993

[54] QUANTUM-WELL DIODE LASER

[75] Inventors: Stephen J. Eglash; Hong K. Choi, both of Concord, Mass.

[73] Assignee: Massachusetts Institute of Technology, Cambridge, Mass.

[21] Appl. No.: 880,622

[22] Filed: May 8, 1992

[51] Int. Cl.$^5$ .............................................. H01S 3/19
[52] U.S. Cl. ..................................... 372/45; 437/129
[58] Field of Search ......................... 372/45; 437/129; 257/14, 15

[56] References Cited

U.S. PATENT DOCUMENTS

| | | | |
|---|---|---|---|
| 4,932,032 | 6/1990 | Koch et al. | 372/45 |
| 5,040,186 | 8/1991 | Logan | 372/45 |
| 5,079,601 | 1/1992 | Esaki et al. | 372/45 |

OTHER PUBLICATIONS

W. D. Goodhue, *The Lincoln Laboratory Journal*, vol. 2, No. 2 (1989) "Using Molecular-Beam Epitaxy to Fabricate Quantum-Well Devices" pp. 183-206.
S. J. Eglash and H. K. Choi, *American Institute of Physics*, Appl. Phys. Lett. 57 (13), Sep. 24, 1990, "Efficient GaInAsSb/AlGaAsSb diode lasers emitting at 2.29 μm" pp. 1292-1294.
Chiu et al., *American Institute of Physics*, Appl. Phys. Lett 917), Oct. 27, 1986, "Room-temperature operation of ImGaAsSb/AlGaSb double Heterostructure lasers near 2.2 μm prepared by molecular beam epitaxy", pp. 1051-1052.
"III-V Diode Lasers for New Emission Wavelengths", Choi et al., *The Lincoln Laboratory Journal*, vol. 3, No. 3, (1990), pp. 395-411.
"High-Efficiency High-Power GaInAsSb-AlGaAsSb Double-Heterostructure Lasers Emitting at 2.3 μm", Choi et al., *IEEE Journal of Quantum Electronics*, vol. 27, No. 6, Jun. 1991, pp. 1555-1559.
C. Caneau, *American Institute of Physics*, Appl. Phys. Lett 51(10), Sep. 7, 1987, pp. 764-766, "Low Temperature CW Operation of GaSb/AlGaSb MQW Laser Diodes Grown by MBE".
Bochkarev et al., *IEEE J. Quantum Electronics*, QE-23, N 6, pp. 1089-1094 (1987), pp. 1362-1363 "Continuous-wave lasing at room temperature in InGaSbAs/GaAlSbAs injection heterostructures emitting in the spectral . . .".
Bocharev et al. *American Institute of Physics*, Sov. J. Quantum Electron. 18(11), Nov. 1988 "Injection Lasers Operating Continuously at Room Temperature at Λ=2.33 μm".
Ohmori et al, *Japanese Journal of Applied Physics*, vol. 24, No. 8, Aug., 1985, pp. L657-L660.

Primary Examiner—Georgia Y. Epps
Attorney, Agent, or Firm—Hamilton, Brook, Smith & Reynolds

[57] ABSTRACT

A GaInAsSb quantum-well laser for highly efficient conversion of input energy to output infrared light is described. The laser consists of an MBE grown active region formed of a plurality of GaInAsSb quantum-well layers separated by AlGaAsSb barrier layers. The active region is sandwiched between AlGaAsSb cladding layers in which the Al content is greater than the Al content in the barrier layers.

71 Claims, 3 Drawing Sheets

QUANTUM-WELL DIODE LASER

GOVERNMENT FUNDING

The Government has rights in this invention pursuant to Contract Number F19628-90-C-0002 awarded by the Department of the Air Force.

BACKGROUND OF THE INVENTION

In recent years, improvements in laser performance have resulted from the fabrication of so-called "superlattice" and quantum-well structures. A lattice is formed of alternate layers of thin (5–40 nm) epitaxial films of semiconductor material of different band gap to form a plurality of heterojunction interfaces. A thin film of narrow band gap material, e.g., GaAs, is sandwiched between thin films of wider band gap material, e.g., $Al_xGa_{(1-x)}As$ to form potential wells in the conduction and valence bands. Such wells restrict or limit carrier/electron movement to two dimensions. Such a multilayer is referred to as a two-dimensional quantum-well, or simply a quantum-well. In the example given, the electron motion is restricted in the direction perpendicular to the heterojunction interfaces, while the electrons are free to move in the other two directions.

Quantum-well heterostructures generally exhibit more efficient luminescence intensities than bulk crystal heterostructures and have, therefore, been incorporated into the active region of laser devices.

Devices are usually formed of multiple layers of quantum-wells and when the barrier thickness between quantum-wells is reduced, so that well wave functions couple, a "superlattice" is formed.

Generally, the materials of choice for superlattice and/or quantum-well structures are the Group III and V elements and, in particular, GaAs and Al alloys thereof. These materials are closely lattice matched, yet the difference in the band gaps of the GaAs versus the alloy $Al_xGa_{(1-x)}As$ can vary at room temperature from 0 eV to as much as 0.75 eV (as x increases from 0 to 1). The first property simplifies heterostructure fabrication, while the second property makes fabrication of quantum-wells possible.

GaAs based quantum-well devices are limited in wavelength range from 0.7 to 0.9 microns. Thus, for certain applications, researchers have turned their attention to other materials. In particular, since 1984, lasers operating at the wavelength of 2–4 microns have been sought for use in long haul communication over fluoride glass fibers. The then current silica fibers utilized a wavelength of 1.55 microns, but were much more lossy than the fluoride glass fibers were predicted to be at a wavelength of 2–4 microns.

Based upon this need, research was directed toward development of GaInAsSb compound structures, since this alloy has a room temperature direct band gap which is continuously adjustable between 0.29 and 0.73 eV and which corresponds to a wide spectral range between 1.7 and 4.3 microns.

Despite the need for such a laser device using this alloy, Chiu et al. report in a 1986 article, "Room-Temperature Operation of InGaAsSb/AlGaSb Double Heterostructure Lasers Near 2.2 μm Prepared by Molecular Beam Epitaxy", *Appl. Phys. Lett.*, 49(17), 27 Oct. '86, pp. 1051–1052, that studies of the growth of this alloy were scarce and no optical device work had been reported.

Chiu et al. in the referenced article report a room temperature GaInAsSb/AlGaSb injection laser using a molecular beam epitaxy (MBE) grown double heterostructure.

The Chiu et al. laser, however, exhibited poor optical and electrical confinement and crystal defects that degraded laser performance. The lattice mismatch between the $Al_{0.35}Ga_{0.65}Sb$ and GaSb materials used by Chiu et al. is $2.3 \times 10^{-3}$. The so-called "critical layer thickness," or the maximum layer thickness that can withstand this lattice mismatch before dislocations are formed, is in the range 100–200 nm. Since the layers of Chiu et al. are much greater than this (two layers of 3 μm each), one can reasonably surmise that a large number of dislocations were formed.

Thus a need exists for a high performance AlGaAsSb laser and, more particularly, for such a laser formed with an advanced more complex quantum-well structure and with minimum crystal defects.

SUMMARY OF THE INVENTION

The present invention comprises a laser and method of making such laser having an active region comprised of a quantum-well region formed of alternate III–V layers of the quaternary compounds GaInAsSb and AlGaAsSb. The GaInAsSb layers form quantum-wells separated by the barrier layers of AlGaAsSb. The active region as a whole is formed between cladding layers. Preferably, all the layers are formed on a GaSb substrate by MBE.

DETAILED DESCRIPTION OF THE INVENTION

Figure 1:
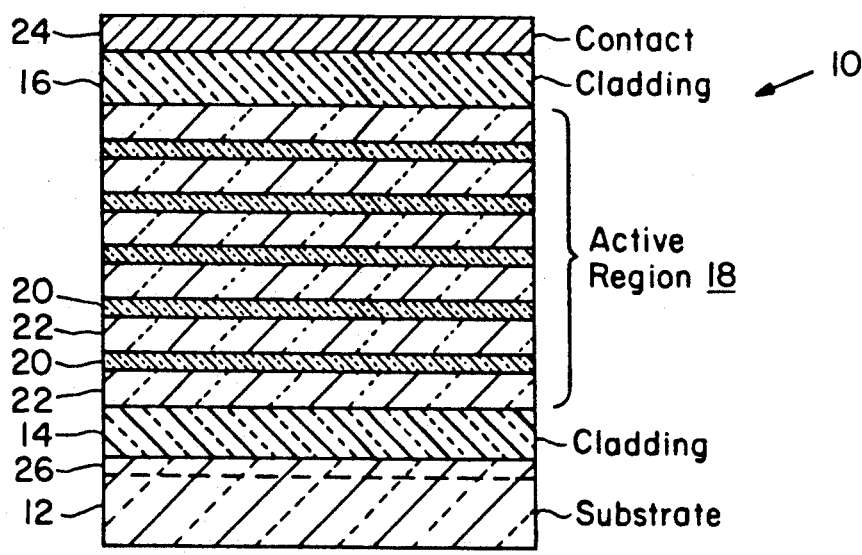
FIG. 1 is a cross-sectional view of a laser diode in accordance with the invention.

The invention will now be described in detail in connection with the drawings and, in particular, with respect to FIG. 1 (which is not to scale). FIG. 1 is a schematic cross-section of a diode laser 1 formed in accordance with the invention.

The GaInAsSb quantum-well laser structure consists of the following layers: substrate 12, optional buffer layer(s) 26, AlGaAsSb cladding layer 14, active region 18 containing one or more GaInAsSb quantum wells 20 separated by AlGaAsSb barriers 22, AlGaAsSb cladding layer 16, and contacting layer 24.

More specifically, a preferred compositional structure for FIG. 1 consists of the following compositions grown on an n-GaSb substrate 12 by molecular beam epitaxy: n+-GaSb buffer 26, 2.0-μm-thick n-$Al_{0.9}Ga_{0.}$- lAs$_{0.07}$Sb$_{0.93}$ cladding 14, an active region consisting of five 10-nm-thick Ga$_{0.84}$In$_{0.16}$As$_{0.14}$Sb$_{0.86}$ wells 20 and six 20-nm-thick Al$_{0.2}$Ga$_{0.8}$As$_{0.02}$SSb$_{0.98}$ barriers 22, 2.0-μm-thick p-Al$_{0.9}$Ga$_{0.1}$As$_{0.07}$Sb$_{0.93}$ cladding layer 16, and 0.05-μm-thick p+-GaSb contacting layer 24.

Preferably, Be is used for the p-type dopant and GaTe to supply Te for the n-type dopant. The more common n-type dopant Si is not recommended because of adverse reaction with GaSb.

The alloy compositions are chosen based upon the desired laser operating characteristics. For example, the Al content in the cladding layers is chosen to be larger than in the barrier layers to provide adequate electrical and optical confinement. Note that while adjacent layers have many elements in common, the growth of adjacent layers will generally require different source fluxes. Conventionally, source fluxes are adjusted by changing source furnace temperatures and waiting several minutes for the fluxes to restabilize. To obtain high-performance laser structures, however, it is important to minimize the duration of any interruptions at these interfaces, particularly in the active region 18.

Several methods are employed in the present invention to minimize growth interruptions. First, MBE growth rates and V:III flux ratios are chosen to eliminate the need for growth interruptions whenever possible. Second, valved sources, such as As or Sb, are used to permit rapid, unrestricted flux variations. Third, the selection of alloy compositions is a compromise between laser physics and materials growth issues.

The detrimental impact of any growth interruptions still necessary, after employing all of the above, is minimized as follows. First, the duration of the interruption is made as brief as possible by adjusting the operating conditions of the MBE system. For example, the source furnace temperature controllers are adjusted for rapid restabilization. Second, the growth conditions are chosen to preserve the composition, purity, and crystal quality of the exposed surface during the interruption. For example, the As and Sb fluxes and substrate temperature are selected to maintain a stable surface. Thin barrier layers of binary compounds may be used in favor of alloys.

GaInAsSb multiple quantum-well diode lasers have been fabricated by MBE, as described above, which emit at about 2.1 μm and have greatly superior performance over previous GaInAsSb double heterostructure lasers emitting between 2.1 and 2.3 μm. Output power up to 190 mW/facet has been achieved for cw operation at a heatsink temperature of 20° C.

All the layers in the fabricated multiple-quantum-well (MQW) structures 10, with the exception of the quantum-well layers 20, are nominally lattice matched to the GaSb substrate 12, and the wells 20 are compressively strained. The structure has excellent surface morphology without any haze or crosshatch patterns, and with only a small density of oval defects. Photoluminescence spectra emitted at 4.5 and 300 K were measured using excitation by 647-nm radiation from a Kr ion laser. At 4.5 K, there is a single, intense peak at 1.88 μm with full width at half-maximum of 11 meV. At 300 K, the peak is somewhat broader, weaker, and shifted to 2.11 μm.

Broad-stripe lasers 100 μm wide were fabricated using a lift-off process described by Choi et al., *IEEE J. Quantum Electron.* 27, 1555 (1991) in which the p+-GaSb contacting layer 24 is etched off in the area between the stripes. The emission spectra of the lasers show multiple longitudinal modes, with full width at half-maximum of about 5 nm. As the cavity length L is decreased from 1000 to 300 μm, the peak emission wavelength for pulsed operation at room temperature decreases from 2.14 to 2.11 μm as a result of increased band filling. For a given device, the wavelength increases with temperature at a rate of about 1.1 nm/° C. because of the decrease in GaInAsSb band gap.

Figure 2:
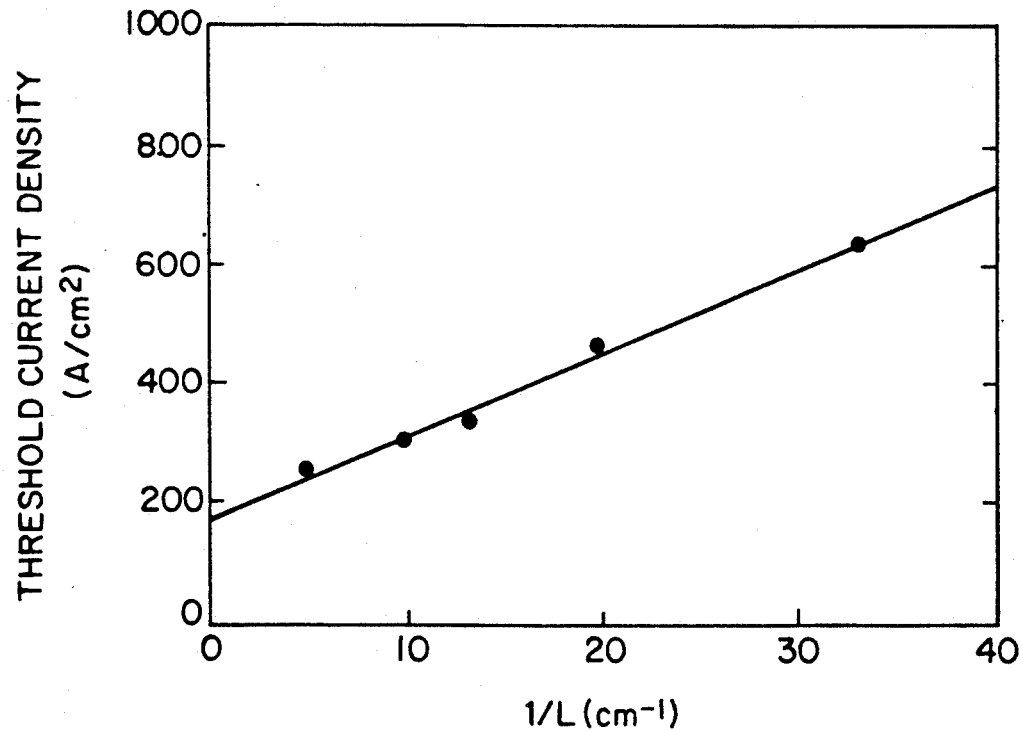
FIG. 2 is a plot of room-temperature pulsed threshold current density versus inverse cavity length for 100μm-wide GaInAsSb/AlGaAsSb multiple-quantum-well lasers made in accordance with the invention.

In FIG. 2, $J_{th}$ for room-temperature pulsed operation is plotted versus 1/L. As L is increased from 300 to 2000 μm, $J_{th}$ decreases from 630 to 260 A/cm$^2$. These values are two to three times lower than those obtained for previous GaInAsSb/AlGaAsSb double-heterostructure lasers, as reported by Choi et al. in *Appl. Phys. Lett.* 59, 1165 (1991). The values for the MQW lasers also compare favorably with those obtained for InGaAs/InGaAsP strained QW lasers emitting at about 1.5 μm. The lowest $J_{th}$ values obtained for the InGaAs/InGaAsP lasers are 160 A/cm$^2$ for single quantum well and ~400 A/cm$^2$ for four quantum wells.

Figure 3:
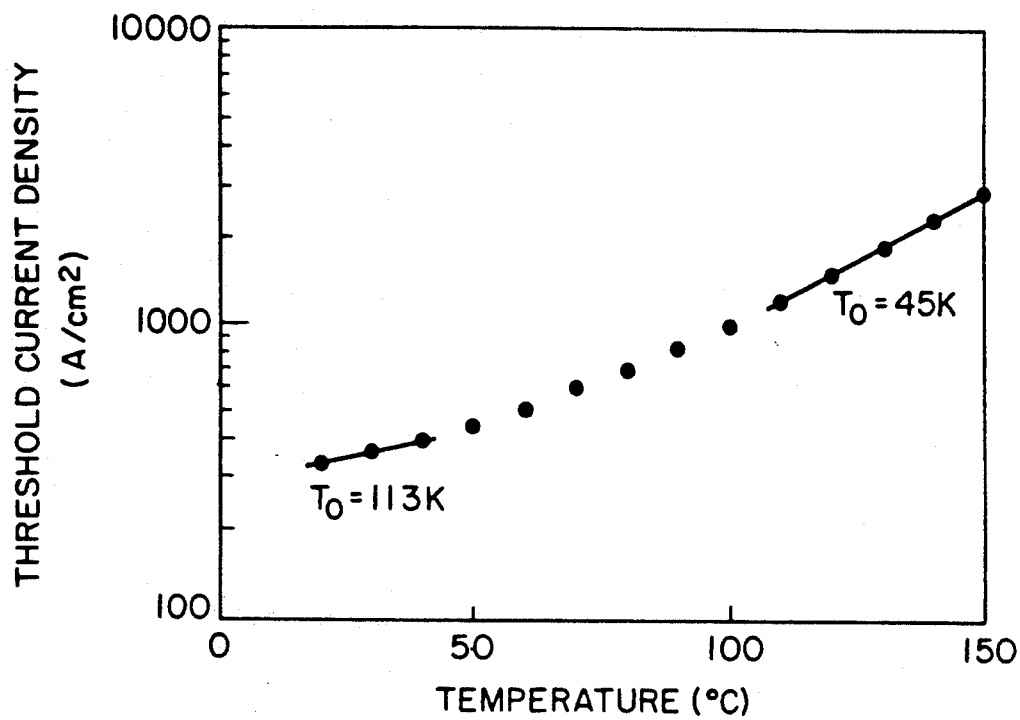
FIG. 3 is a plot of pulsed threshold current density versus heatsink temperature for a multiple-quantum-well GaInAsSb/AlGaAsSb laser 1000 μm long made in accordance with the invention.

FIG. 3 shows $J^{th}$ versus heatsink temperature for pulsed operation up to 150° C. of an MQW laser 1000 μm long. Near room temperature, the characteristic temperature $T_0$ is 113 K, compared with about 50 K for DH lasers. The marked increase in $T_0$ indicates that losses due to Auger recombination are substantially reduced in the MQW devices. At temperatures higher than 100° C., however, $T_0$ decreases to 45 K, probably because of the increase in Auger recombination which increases with increasing temperature. The dramatic improvement in the room-temperature $T_0$ value for GaInAsSb/AlGaAsSb MQW lasers relative to DH devices is in marked contrast with the results for InGaAs/InGaAsP lasers. For both DH and QW InGaAs/GaInAsP devices, the $T_0$ values are about 50 K, except for one report of $T_0$ as high as 97 K for MQW lasers.

Figure 4:
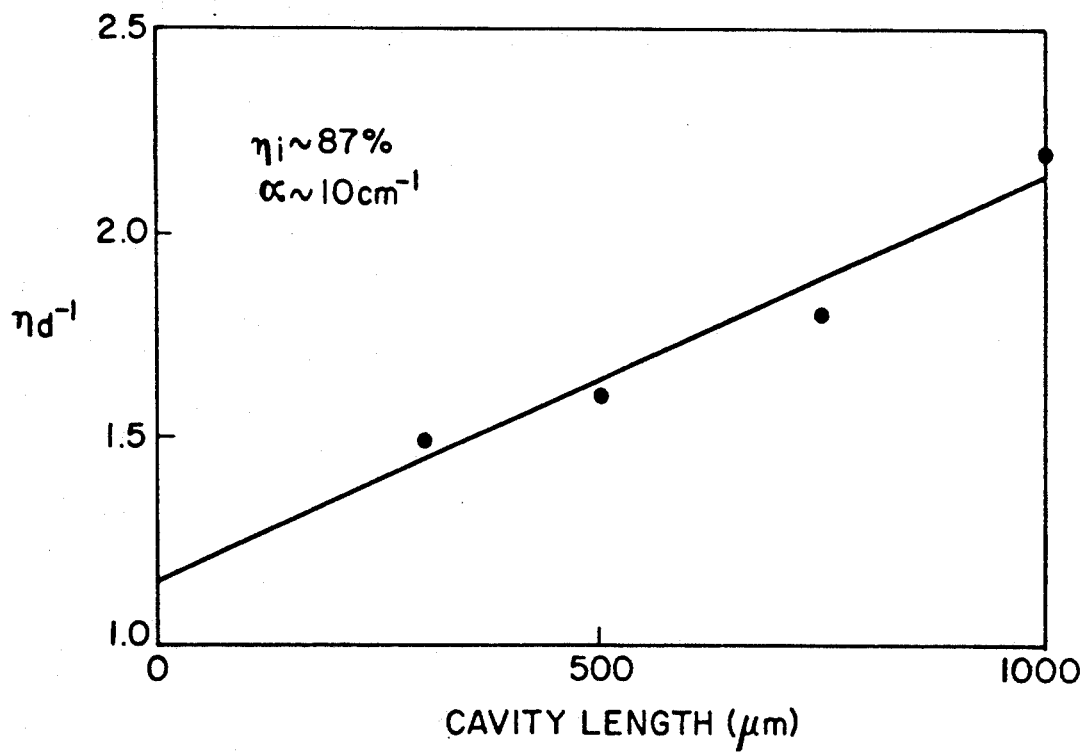
FIG. 4 is a plot of pulsed inverse differential quantum efficiency versus cavity length for 100-μm-wide GaInAsSb/AlGaAsSb multiple-quantum-well lasers made in accordance with the invention.

FIG. 4 shows the inverse differential quantum efficiency $\eta_d$ of the present device as a function of cavity length L. The highest value of $\eta_d$ is 70% for L=300 μm. From the intercept and slope of the straight line fitted to the data, the internal quantum efficiency is about 87% and the internal loss coefficient is about 10 cm$^{-1}$, compared with 43 cm$^{-1}$ obtained for DH lasers. The substantial reduction in internal loss coefficient results from a decrease in optical confinement in the MQW active region, since the absorption coefficient is smaller in the cladding layers than in the MQW region. These results indicate that laser performance might be improved by optimizing the structure, e.g. by reducing the number of quantum wells.

Figure 5:
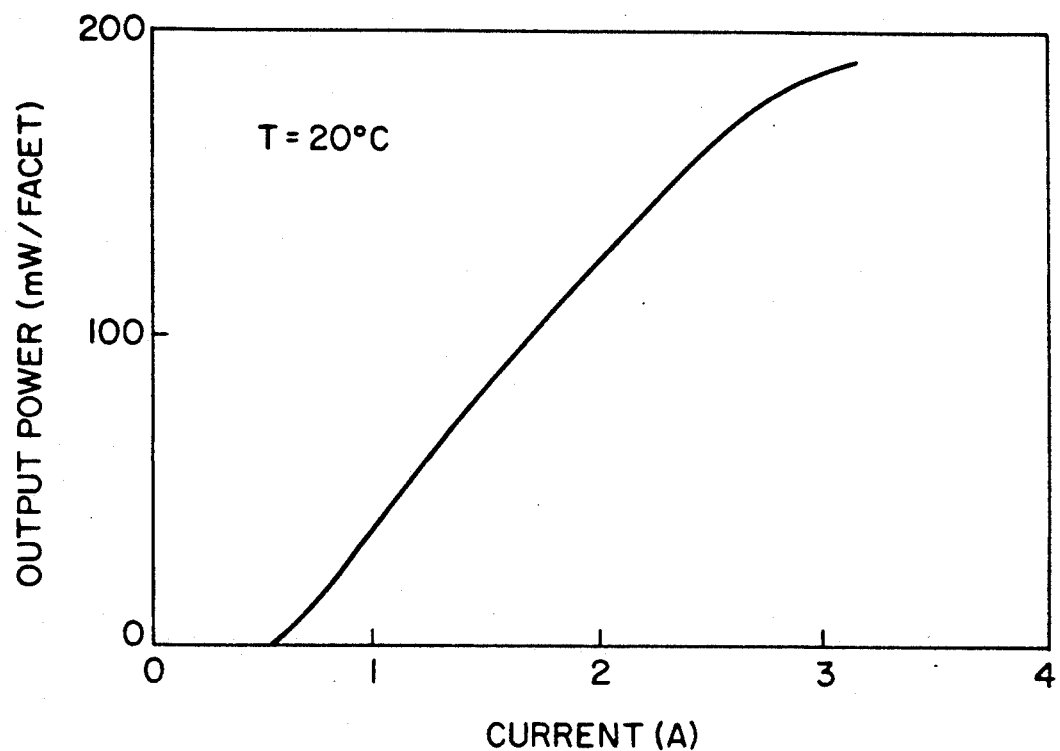
FIG. 5 is a plot of output power versus current for cw operation of a 100-μm-wide by 1000-μm-long GaInAsSb/AlGaAsSb multiple-quantum-well laser made in accordance with the invention.

Lasers with a silicon-nitride-defined strip 100 μm wide were fabricated for cw operation. Because of current spreading in the p+contacting layer below the silicon nitride, the pulsed $J_{th}$ values were about 50% higher than those for mesa-stripe devices described in connection with FIG. 1. Several devices 1000 μm long were mounted junction-side down on copper heatsinks using In solder. FIG. 5 shows the output power versus current curve for a device operated at a heatsink temperature of 20° C. The threshold current is about 570 mA, and the initial slope efficiency is about 0.1 W/A per facet. The maximum output power is 190 mW/facet, limited by the junction temperature rise.

Equivalents

This completes the description of the preferred embodiments of the invention. However, it is to be understood that various modifications thereof may be made by those skilled in the art without departing from the scope of the invention, as defined by the claims hereinafter set forth. For example, alternate epitaxial growth processes may be used in place of MBE, such as Organometallic Vapor Phase Epitaxy (OMVPE) or gas source MBE or chemical beam epitaxy (CBE), provided the quality structural criteria enumerated above could be met. Improvements in performance may be realized by changing the barrier composition in order to vary the degree of carrier confinement, or by changing the well composition in order to vary the degree of lattice strain in the quantum-wells, as well as by adjusting the number and thickness of the wells. Strain is an important parameter for GaInAsSb quantum-well lasers because it effects the bandgap (and hence the emission wavelength), the band offsets (and hence the carrier confinement), and the valence band structure (and hence the magnitude of losses such as Auger recombination and free-carrier absorption). GaInAsSb quantum-well lasers can be formed in which the GaInAsSb quantum wells are (i) lattice matched, (ii) tensile strained, and (iii) compressively strained. AlGaAsSb barrier layers can be formed with strain opposite to that of the quantum-well layers, so as to balance the strain. Initial results indicate that compressively strained quantum wells are preferred for lasers emitting near 2 $\mu$m.

For example, a laser having the following layer compositions will produce a lattice constant which, with respect to the lattice constant of a GaSb substrate, produces compressive strain in the quantum wells:

cladding layers: $Al_{0.9}Ga_{0.1}As_{0.07}Sb_{0.93}$
quantum-well layers: $Ga_{0.85}In_{0.15}As_{0.05}Sb_{0.95}$
barrier layers: $Al_{0.2}Ga_{0.8}As_{0.02}Sb_{0.98}$ In this case, the thickness of the layers should be as follows:

cladding layers: 2.0 microns
quantum-well layers: 10 nm
barrier layers: 20 nm

The invention is not limited to use of the disclosed active region for diode lasers. Other contemplated applications include light-emitting diodes, and side or longitudinally optically pumped lasers, in which case the contact layer and the cladding layers are not doped.

Compositional structures other than as described in connection with FIG. 1 are also contemplated. Structures, e.g. with fewer quantum wells or with a higher Al content in the barrier layers, might be preferable for lasers emitting near 2 $\mu$m, and other structures with different quantum-well alloy compositions are required for lasers emitting at different wavelengths.

In FIG. 1 there is only one cladding layer composition and it changes abruptly at the cladding-layer/barrier-layer interfaces. It is contemplated that (i) a plurality of cladding layers having different compositions to form a so-called "separate-confinement heterostructure" could be substituted thereof and/or (ii) a region of graded (or varying) composition added between the cladding layers and the active region to form a so-called "graded-index" structure. Such structures are likely to be beneficial to GaInAsSb quantum-well lasers.

Also, the series resistance of the diode laser can be reduced by grading the Al content at the lower (n-type) buffer-layer/cladding-layer interface and also at the upper (p-type) cladding-layer/contacting-layer interface. The grading is such that (i) the grading occurs sufficiently gradually (approximately 50 nm), (ii) the graded region is heavily doped, and (iii) the composition is adjusted continuously throughout the graded region in such a manner as to avoid the formation of crystal defects.

Substrates other than GaSb may be used in connection with the invention. In particular, InAs would be an excellent candidate.

We claim:

1. A laser comprised of a body within a resonant cavity and formed of a plurality of quantum-well layers separated by barrier layers forming a planar active region with cladding layers on each planar side of the active region and wehrein the quantum-well layers are formed of an alloy composed of the following elements GaInAsSb and the cladding and barrier layers of an alloy composed of the following elements AlGaAsSb.

2. The laser of claim 1 wherein one of the cladding layers is doped n-type and the other is doped p-type and a contact layer is applied to the p-type doped cladding layer to form a diode laser.

3. The laser of claim 1 wherein the active region is optically pumped.

4. The laser of claim 1 wherein the Al content in the cladding layers is larger than in the barrier layers.

5. The laser of claim 1 wherein the layers are formed on a GaSb substrate.

6. The laser of claim 1 wherein the layers are formed by molecular beam epitaxial growth.

7. The laser of claim 1 wherein the wavelength of the light emitted by the laser is in the range of about 1.5 to 5 microns.

8. The laser of claim 1 wherein the composition of the layers is as follows:

cladding layers: $Al_{0.9}Ga_{0.1}As_{0.07}Sb_{0.93}$
quantum-well layers: $Ga_{0.84}In_{0.16}As_{0.14}Sb_{0.86}$
barrier layers: $Al_{0.2}Ga_{0.8}As_{0.02}Sb_{0.98}$.

9. The laser of claim 8 wherein the thickness of the layers is as follows:

cladding layers: 2.0 microns
quantum-well layers: 10 nm
barrier layers: 20 nm.

10. The laser of claim 2 wherein the n-type dopant is Te and the p-type dopant is Be.

11. A method of forming a laser comprising:
a) forming a body comprised of a plurality of quantum-well layers separated by barrier layers;
b) forming cladding layers on opposite sides of the active region and wherein the quantum-well layers are formed of an alloy composed of the following elements GaInAsSb and the barrier and cladding layers of an alloy composed of the following elements: AlGaAsSb; and
c) disposing the body within a resonant cavity.

12. The method of claim 11 wherein one of the cladding layers is doped n-type and the other is doped p-type and a contact layer is applied to the p-type doped cladding layer to form a diode laser.

13. The method of claim 11 including the step of optically pumping the active region.

14. The method of claim 11 including making the Al content in the cladding layers larger than in the barrier layers.

15. The method of claim 11 wherein the layers are formed on a GaSb substrate.

16. The method of claim 11 wherein the layers are formed by molecular beam epitaxial growth.

17. The method of claim 11 wherein the thickness of the layers and the ratio of the elements is selected such that the wavelength of the light emitted by the laser is in the range of about 1.5 to 5 microns.

18. The method of claim 11 wherein the composition of the layers is formed as follows:
cladding layers: $Al_{0.9}Ga_{0.1}As_{0.07}Sb_{0.93}$
quantum-well layers: $Ga_{0.84}In_{0.16}As_{0.14}Sb_{0.86}$
barrier layers: $Al_{0.2}Ga_{0.8}As_{0.02}Sb_{0.98}$.

19. The method of claim 18 wherein the thickness of the layers is formed as follows:
cladding layers 2.0 microns
quantum-well layers: 10 nm
barrier layers: 20 nm.

20. The method of claim 12 wherein the n-type dopant is Te and the p-type dopant is Be.

21. A infrared emitting laser comprised of a body formed of a plurality of quantum-well layers separated by barrier layers forming a planar active region with cladding layers on each planar side of the active region and wherein the quantum-well layers are formed of $Ga_{0.84}In_{0.16}As_{0.14}Sb_{0.86}$, the barrier layers of $Al_{0.2}Ga_{0.8}As_{0.02}Sb_{0.98}$ and the cladding layers of $Al_{0.9}Ga_{0.1}As_{0.07}Sb_{0.93}$ and wherein said body is disposed within a resonant cavity.

22. The laser of claim 21 wherein one of the cladding layers is doped n-type and the other is doped p-type and a contact layer is applied to the p-type doped cladding layer to form a diode laser.

23. The laser of claim 21 wherein the active region is optically pumped to produce laser emission.

24. The laser of claim 21 wherein the Al content in the cladding layers is larger than in the barrier layers.

25. The laser of claim 21 wherein the wavelength of the light emitted by the laser is in the range of about 1.5 to 5 microns.

26. An infrared emitting laser comprised of a body formed of a quantum-well layer bounded on two sides by barrier layers forming an active region, cladding layers on opposite sides of the active region and wherein the quantum well-layer is formed of an alloy of the elements GaInAsSb and the barrier and cladding regions of an alloy of AlGaAsSb and the body is formed on a substrate within a resonant cavity.

27. The laser of claim 26 wherein the composition of the alloy elements in the layers is selected to produce lattice constants equal to the lattice constant of the substrate.

28. The laser of claim 27 wherein the substrate is formed of GaSb.

29. The laser of claim 26 wherein the composition of the alloy elements in the layers is selected to produce lattice constants which differ to produce a strained active region.

30. The laser of claim 29 wherein the strain is compressive.

31. A laser comprised of a body formed of a quantum-well layer bounded on two sides by barrier layers forming a planar active region with cladding layers on each planar side of the active region and wherein the quantum-well layer is formed of an alloy of GaInAsSb and the cladding and barrier layers of an alloy of AlGaAsSb and the body is disposed within a resonant cavity.

32. A laser of claim 31 wherein one of the cladding layers is doped n-type and the other is doped p-type and a contact layer is applied to the p-type doped cladding layer to form a diode laser.

33. The laser of claim 31 wherein the active region is optically pumped.

34. The laser of claim 31 wherein the aluminum content in the cladding layers is larger than in the barrier layers.

35. The laser of claim 31 wherein the layers are formed on a GaSb substrate.

36. The laser of claim 31 wherein the layers are formed by molecular beam epitaxial growth.

37. The laser of claim 31 wherein the wavelength of the light emitted by the laser is in the range of about 1.5 to 5 microns.

38. The laser of claim 31 wherein the composition of the layers is as follows:
cladding layers: $Al_{0.9}Ga_{0.1}As_{0.07}Sb_{0.93}$
quantum-well layer: $Ga_{0.84}In_{0.16}As_{0.14}Sb_{0.86}$
barrier layers: $Al_{0.2}Ga_{0.8}As_{0.02}Sb_{0.98}$.

39. The laser of claim 38 wherein the thickness of the layers is as follows:
cladding layers: 2.0 microns
quantum-well layer: 10 nm
barrier layers: 20 nm.

40. The laser of claim 32 wherein the n-type dopant is Te and the p-type dopant is Be.

41. The laser of claim 31 wherein the compositions of the alloy elements are selected to have identical lattice constants.

42. The laser of claim 35 wherein the compositions of the alloy elements are selected to produce lattice constants equal to the lattice constant of GaSb.

43. The laser of claim 32 wherein the compositions of the alloy elements are as follows:
quantum-well layers: $Ga_xIn_{1-x}As_ySb_{1-y}$ and $y=0.91(1-x)/(1+0.05x)$
barrier layers: $Al_wGa_{1-w}As_zSb_{1-z}$ and and
cladding layers: $z=0.08 w$ 44. The laser of claim 31 wherein the compositions of the alloy elements of the barrier layers and quantum-well layers are selected to have lattice constants which differ from the lattice constants of the cladding layers to produce a strained quantum well active region.

45. The laser of claim 44 wherein the strain is tensile.

46. The laser of claim 44 wherein the strain is compressive.

47. The laser of claim 31 wherein the compositions of the alloy elements are as follows:
cladding layers: $Al_{0.9}Ga_{0.1}As_{0.07}Sb_{0.93}$
quantum-well layer: $Ga_{0.85}In_{0.15}As_{0.05}Sb_{0.95}$
barrier layers: $Al_{0.2}a_{0.8}As_{0.02}Sb_{0.98}$ 48. The laser of claim 31 wherein the laser is formed on a substrate and including a buffer layer between the substrate and cladding layers.

49. The laser of claim 31 wherein the index of refraction of the cladding layers is continuously varied over the thickness thereof to produce a graded index of refraction confinement structure.

50. The method of forming a laser comprising:
a) forming a body with an active region of a quantum-well layer with barrier layers on either side of said quantum-well layer;
b) forming cladding layers on opposite sides of the active region and wherein the quantum-well layer is formed of an alloy comprised of GaInAsSb and the barrier and cladding layers of an alloy comprised of AlGaAsSb;
c) disposing the body within a resonant cavity.

51. The method of claim 50 wherein one of the cladding layers is doped n-type and the other is doped p- type and a contact layer is applied to the p-type doped cladding layer to form a diode laser.

52. The method of claim 50 including the step of optically pumping the active region.

53. The method of claim 50 including making the aluminum content in the cladding layers larger than in the barrier layers.

54. The method of claim 50 wherein the layers are formed on a GaSb substrate.

55. The method of claim 50 wherein the layers are formed by molecular beam epitaxial growth.

56. The method of claim 50 wherein the thickness of the layers and the ratio of the elements is selected such that the wavelength of the light emitted by the laser is in the range of about 1.5 to 5 microns.

57. The method of claim 50 wherein the composition of the layers is as follows:
cladding layers: $Al_{0.9}Ga_{0.1}As_{0.07}Sb_{0.93}$
quantum-well layer: $Ga_{0.84}In_{0.16}As_{0.14}Sb_{0.86}$
barrier layers: $Al_{0.2}Ga_{0.8}As_{0.02}Sb_{0.98}$ 58. The method of claim 51 wherein the thickness of the layers is formed as follows:
cladding layer: 2.0 microns
quantum-well layers: 10 nm
barrier layers: 20 nm 59. The method of claim 58 wherein the n-type dopant is Te and the p-type dopant is Be.

60. The method of claim 50 wherein the compositions of the alloy elements are selected to have identical lattice constants.

61. The method of claim 54 wherein the compositions of the alloy elements are selected to produce lattice constants equal to the lattice constant of GaSb.

62. The method of claim 61 wherein the compositions of the alloy elements are as follows:
quantum-well layer: $Ga_xIn_{1-x}As_{y-1}Sb_{1-y}$ and $y=0.91(1-x)/(1+0.5x)$
barrier layers: $Al_wGa_{1-w}As_zSb_{1-z}$ and cladding layers: $z=0.08w$ 63. The method of claim 50 wherein the compositions of the alloy elements of the barrier layers and quantum-well layer are selected to have lattice constants which differ from the lattice constants of the cladding layers to produce a strained quantum well active region.

64. The method of claim 63 wherein the strain is tensile.

65. The method of claim 63 wherein the strain is compressive.

66. The method of claim 11 wherein the compositions of the alloy elements are as follows:
cladding layer $Al_{0.9}Ga_{0.1}As_{0.07}Sb_{0.93}$
quantum-well layers: $Ga_{0.85}In_{0.15}As_{0.05}Sb_{0.95}$
barrier layers: $Al_{0.2}Ga_{0.8}As_{0.02}Sb_{0.98}$ 67. An infrared emitting laser comprised of a quantum-well layer bonded on opposite planar sides by barrier layers forming a planar active region with cladding layers on each planar side of the active region and wherein the quantum-well layer is formed of $Ga_{0.84}In_{0.16}As_{0.14}Sb_{0.86}$, the barrier layers of $Al_{0.2}Ga_{0.8}As_{0.02}Sb_{0.98}$ and the cladding layers of $Al_{0.9}Ga_{0.1}As_{0.07}Sb_{0.93}$.

68. The laser of claim 67 wherein one of the cladding layers is doped n-type and the other is doped p-type and a constant layer is applied to the p-type doped cladding layer to form a diode laser.

69. The laser of claim 67 wherein the active region is optically pumped to produce laser emission.

70. The laser of claim 67 wherein the aluminum content is the cladding layers is larger than in the barrier layers.

71. The laser of claim 67 wherein the wavelength of the light emitted by the laser is in the range of about 1.5 to 5 microns.

* * * * *

UNITED STATES PATENT AND TRADEMARK OFFICE
CERTIFICATE OF CORRECTION

PATENT NO. : 5,251,225
DATED : Oct. 5, 1993
INVENTOR(S) : Stephen J. Eglash and Hong K. Choi It is certified that error appears in the above-identified patent and that said Letters Patent is hereby corrected as shown below:

Col. 8, line 9, delete "rang e" and insert --range--.

Col. 10, line 27, delete "constant" and insert --contact--.

Signed and Sealed this

Twenty-fourth Day of May, 1994

*Attest:*

BRUCE LEHMAN

*Attesting Officer*   *Commissioner of Patents and Trademarks*